(12) United States Patent
Yamanaka et al.

(10) Patent No.: US 8,723,396 B2
(45) Date of Patent: May 13, 2014

(54) SURFACE ACOUSTIC WAVE DEVICE, ELECTRONIC APPARATUS, AND SENSOR APPARATUS

(75) Inventors: Kunihito Yamanaka, Kamiina (JP); Takuya Owaki, Kamiina (JP); Naohisa Obata, Kamiina (JP)

(73) Assignee: Seiko Epson Corporation (JP)

( * ) Notice: Subject to any disclaimer, the term of this patent is extended or adjusted under 35 U.S.C. 154(b) by 293 days.

(21) Appl. No.: 13/223,581

(22) Filed: Sep. 1, 2011

(65) Prior Publication Data

US 2012/0062070 A1 Mar. 15, 2012

(30) Foreign Application Priority Data

Sep. 9, 2010 (JP) ................................. 2010-201750

(51) Int. Cl.
*H03H 9/25* (2006.01)

(52) U.S. Cl.
USPC .................... 310/313 A; 310/313 D; 310/360; 310/361

(58) Field of Classification Search
USPC ........................... 310/313 A, 313 D, 360, 361
See application file for complete search history.

(56) References Cited

U.S. PATENT DOCUMENTS

| | | | |
|---|---|---|---|
| 4,387,355 A | 6/1983 | Uno et al. | |
| 5,757,250 A | 5/1998 | Ichikawa et al. | |
| 5,895,996 A | 4/1999 | Takagi et al. | |
| 6,329,888 B1 | 12/2001 | Hirota | |
| 6,674,215 B1 | 1/2004 | Yoshida et al. | |
| 7,027,921 B2 * | 4/2006 | Kalantar-Zadeh et al. | 702/2 |
| 7,352,104 B2 | 4/2008 | Yamazaki et al. | |
| 7,382,217 B2 | 6/2008 | Morita et al. | |
| 7,589,451 B2 | 9/2009 | Morita et al. | |
| 7,696,675 B2 | 4/2010 | Kanna | |
| 8,063,534 B2 * | 11/2011 | Iizawa | 310/313 B |
| 8,084,918 B2 * | 12/2011 | Iizawa | 310/313 B |
| 8,237,326 B2 * | 8/2012 | Iizawa | 310/313 B |
| 8,305,162 B2 | 11/2012 | Yamanaka | |
| 2003/0052572 A1 | 3/2003 | Iizawa et al. | |
| 2003/0168932 A1 | 9/2003 | Shibata et al. | |

(Continued)

FOREIGN PATENT DOCUMENTS

| | | |
|---|---|---|
| CN | 1336036 A | 2/2002 |
| CN | 1434568 A | 8/2003 |

(Continued)

OTHER PUBLICATIONS

Takehiko Uno, Nobuhide Miyamoto and Hiroshi Abe (Electrical Communication Laboratories, NTT), "Fabrication of SAW Resonators with Groove Gratings and their Characteristics", (Oct. 18, 1982) (pp. 45-52) with English translation.

*Primary Examiner* — Thomas Dougherty

(74) *Attorney, Agent, or Firm* — Harness, Dickey & Pierce, P.L.C.

(57) ABSTRACT

A SAW device has an IDT which is provided on the principal surface of a quartz crystal sustrate having Euler angles ($-1.5°\leq\phi\leq1.5°$, $117°\leq\theta\leq142°$, $\psi$) and excites a SAW in a stopband upper end mode. Inter-electrode-finger grooves 8 are recessed between the electrode fingers of the IDT. When the Euler angle $\psi$ is $42.79°\leq|\psi|\leq49.57°$, the thickness H of the electrode fingers of the IDT is set to be within $0.055$ $\mu m\leq H\leq0.335$ $\mu m$, preferably, $0.080$ $\mu m\leq H\leq0.335$ $\mu m$. When the Euler angle $\psi$ is $|\psi|\neq90°\times n$ (where n=0, 1, 2, 3), and the thickness H of the electrode fingers is set to $0.05$ $\mu m\leq H\leq0.20$ $\mu m$.

24 Claims, 6 Drawing Sheets

(56) References Cited

U.S. PATENT DOCUMENTS

| | | |
|---|---|---|
| 2004/0135469 A1* | 7/2004 | Kanna ............... 310/313 A |
| 2005/0122179 A1* | 6/2005 | Ogiso ............... 331/107 A |
| 2005/0168302 A1 | 8/2005 | Orito et al. |
| 2006/0108894 A1* | 5/2006 | Kanna ............... 310/313 A |
| 2006/0145568 A1* | 7/2006 | Morita et al. ........ 310/313 A |
| 2007/0182278 A1 | 8/2007 | Kanna |
| 2008/0084134 A1* | 4/2008 | Morita et al. ........ 310/313 A |
| 2009/0021108 A1 | 1/2009 | Owaki et al. |
| 2009/0206955 A1 | 8/2009 | Iizawa |
| 2010/0219913 A1* | 9/2010 | Yamanaka ............ 333/195 |
| 2010/0244626 A1 | 9/2010 | Yamanaka |
| 2011/0309897 A1 | 12/2011 | Yamanaka |
| 2012/0049979 A1 | 3/2012 | Owaki et al. |
| 2012/0062069 A1 | 3/2012 | Yamanaka |
| 2012/0062329 A1 | 3/2012 | Yamanaka |
| 2012/0068573 A1* | 3/2012 | Obata ............... 310/313 A |
| 2012/0086308 A1* | 4/2012 | Obata et al. ......... 310/313 A |
| 2012/0139652 A1 | 6/2012 | Yamanaka |
| 2012/0212301 A1* | 8/2012 | Yamanaka ............ 331/158 |
| 2012/0223411 A1 | 9/2012 | Cho et al. |
| 2013/0027147 A1 | 1/2013 | Yamanaka |

FOREIGN PATENT DOCUMENTS

| | | |
|---|---|---|
| CN | 1619956 A | 5/2005 |
| CN | 101820265 A | 9/2010 |
| JP | 57-005418 | 1/1982 |
| JP | 61-092011 | 5/1986 |
| JP | 63-088910 | 4/1988 |
| JP | 1-34411 | 7/1989 |
| JP | 01-231412 | 9/1989 |
| JP | 02-189011 | 7/1990 |
| JP | 05-090865 | 4/1993 |
| JP | 08-307190 | 11/1996 |
| JP | 10-270974 | 10/1998 |
| JP | 3216137 | 8/2001 |
| JP | 3216137 B2 | 10/2001 |
| JP | 3266846 | 1/2002 |
| JP | 2002-100959 | 4/2002 |
| JP | 2003-283282 | 10/2003 |
| JP | 2005-204275 | 7/2005 |
| JP | 2006-013576 | 1/2006 |
| JP | 2006-148622 | 6/2006 |
| JP | 2006-203408 | 8/2006 |
| JP | 3851336 | 11/2006 |
| JP | 2007-208871 | 8/2007 |
| JP | 2007-267033 | 10/2007 |
| JP | 2007-300287 | 11/2007 |
| JP | 2009-225420 | 10/2009 |
| WO | WO 2005/099089 | 10/2005 |
| WO | WO-2006-137464 A1 | 12/2006 |
| WO | WO-2010-098139 A1 | 9/2010 |

* cited by examiner

SURFACE ACOUSTIC WAVE DEVICE, ELECTRONIC APPARATUS, AND SENSOR APPARATUS

TECHNICAL FIELD

The present invention relates to a surface acoustic wave device, such as a resonator or an oscillator using a surface acoustic wave (SAW), and an electronic apparatus and a sensor apparatus including the same.

RELATED ART

SAW devices are widely used in electronic apparatuses, such as a mobile phone, a hard disk, a personal computer, a receiver tuner of BS and CS broadcasts, an apparatus which processes a high-frequency signal or an optical signal propagating through a coaxial cable or an optical cable, a server network apparatus which requires a high-frequency and high-precision clock (low jitter and low phase noise) in a wide temperature range, and a wireless communication apparatus, or various sensor apparatuses, such as a pressure sensor, an acceleration sensor, and a rotational speed sensor. In these apparatuses and devices, in particular, with the realization of a high-frequency reference clock due to recent high-speed performance of information communication or the reduction in the size of the apparatus casing, there is an increasing influence of heat generation inside the apparatus. For this reason, with regard to an electronic device which is mounted in the apparatus, expansion or high-precision performance of an operation temperature range is required. A stable operation is required over a long period in an environment in which there is a severe change in the temperature from a low temperature to a high temperature, like a wireless base station outdoors.

In general, in a SAW device, such as a SAW resonator, a change in the frequency-temperature characteristic is significantly influenced by the SAW stopband, the cut angle of a quartz crystal substrate to be used, the form of an IDT (interdigital transducer) formed on the substrate, or the like. For example, a reflection inverting-type SAW converter is suggested in which an IDT having a unit segment repeatedly arranged on a piezoelectric substrate is provided, the unit segment having three electrode fingers per SAW wavelength, and the upper mode and lower mode of the SAW stopband are excited (for example, see Japanese Patent No. 3266846). If a SAW filter is constituted by the reflection inverting-type SAW converter, it is possible to realize a high attenuation amount in a blocked band on a high-frequency band side near a passband.

A reflection inverting-type SAW converter is known in which a so-called ST cut quartz crystal substrate having Euler angles ($\phi$, $\theta$, $\psi$)=(0°, 123°, 0°) is used (for example, see JP-A-2002-100959). JP-A-2002-100959 describes that the resonance of the upper end of the stopband can be excited, and the frequency-temperature characteristic is improved compared to a case where the resonance of the lower end of the stopband is used. It is reported that the upper end of the SAW stopband has a satisfactory frequency-temperature characteristic compared to the lower end of the stopband (for example, see JP-A-2006-148622, JP-A-2007-208871, JP-A-2007-267033 and JP-A-2007-300287).

In particular, JP-A-2006-148622 and JP-A-2007-208871 describe a technique which adjusts the cut angle of the quartz crystal substrate and thickens the standardized thickness (H/$\lambda$) of an IDT electrode to about 0.1 so as to obtain a satisfactory frequency-temperature characteristic in a SAW device using a Rayleigh wave. A SAW resonator described in JP-A-2006-148622 has a single-type IDT electrode in which a unit segment having two electrode fingers per SAW wavelength is repeatedly arranged on a quartz crystal substrate having Euler angles ($\phi$, $\theta$, $\psi$)=($\phi$=0°, 0°≤$\theta$≤180°, 0°<|$\psi$|<90°). Thus, the Rayleigh wave is excited in the stopband upper limit mode, thereby realizing high-frequency performance and a satisfactory frequency-temperature characteristic of a SAW resonator. JP-A-2006-148622 describes that a change amount in an oscillation frequency when the IDT electrode thickness increases is smaller in the stopband upper limit mode than in the stopband lower limit mode.

JP-A-2007-208871 describes a technique which, in a SAW device which has the single-type IDT electrode, sets a quartz crystal substrate at Euler angles ($\phi$, $\theta$, $\psi$)=($\phi$=0°, 110°≤$\theta$≤140°, 38°≤|$\psi$|≤44°), and sets the relationship between the standardized electrode thickness (H/$\lambda$) and the standardized electrode width $\eta$ (=d/P) defined by the thickness H of the IDT electrode, the width d of an electrode finger in the IDT electrode, the pitch P between electrode fingers in the IDT electrode, and the SAW wavelength $\lambda$ as follows.

$$H/\lambda \leq 0.1796\eta^3 - 0.4303\eta^2 + 0.207\eta + 0.0682$$

Thus, it is possible to strongly excite the Rayleigh wave in the stopband upper limit mode.

JP-A-2007-267033 describes a SAW element in which a single-type IDT electrode is arranged on a quartz crystal substrate having Euler angles ($\phi$, $\theta$, $\psi$)=(0°, $\theta$, 9°<|$\psi$|<46°), preferably, (0°, 95°<$\theta$<155°, 33°|<$\psi$|<46°), and the standardized electrode thickness (H/$\lambda$) is 0.045≤H/$\lambda$≤0.085. Thus, the Rayleigh wave is excited in the stopband upper limit mode, thereby realizing a satisfactory frequency-temperature characteristic.

JP-A-2007-300287 describes a SAW element in which the single-type IDT electrode is arranged on an in-plane rotation ST cut quartz crystal substrate having Euler angles ($\phi$, $\theta$, $\psi$)=(0°, 123°, 43.2°), and the standardized electrode thickness (H/$\lambda$) is H/$\lambda$=0.06, so-called 6% $\lambda$, thereby exciting the Rayleigh wave in the stopband upper limit mode. The SAW element sets the standardized electrode width $\eta$ (=Lt/Pt) defined by the electrode finger width Lt of the IDT electrode and the electrode finger pitch Pt to 0.5≤$\eta$≤0.7, thereby realizing a frequency deviation of maximum 830 ppm at normal temperature (25° C.)

A SAW resonator is also known in which grooves are formed in the surface of a quartz crystal substrate between electrode fingers constituting an IDT and between conductor strips constituting a reflector (for example, see JP-B-2-7207 (JP-A-57-5418) and Manufacturing Conditions and Characteristics of Groove-type SAW Resonator (IECE, Technical Research Report MW82-59 (1982))). JP-B-2-7207 (JP-A-57-5418) describes a SAW resonator in which an IDT and a reflector are formed of aluminum electrodes on an ST cut X-propagation quartz crystal substrate, and grooves are formed in the corresponding regions between electrode fingers constituting the IDT and between conductor strips constituting the reflector on the surface of the quartz crystal substrate, thereby realizing a high Q value, a low capacitance ratio, and low resonance resistance. JP-B-2-7207 (JP-A-57-5418) describes a structure in which the groove of the IDT and the groove of the reflector have the same depth and a structure in which the groove of the reflector is greater in depth than the groove of the IDT.

Manufacturing Conditions and Characteristics of Groove-type SAW Resonator (IECE, Technical Research Report MW82-59 (1982)) describes the characteristic of a groove-type SAW resonator using an ST cut quartz crystal substrate.

It has been reported that the frequency-temperature characteristic changes depending on the depth of the grooves formed in a quartz crystal surface uncovered with the electrodes of the SAW propagation substrate, and as the depth of the grooves increases, the peak temperature Tp of an upward convex quadratic curve decreases.

A method which forms grooves in a piezoelectric substrate, such as quartz crystal, to adjust an effective thickness and to adjust a frequency is well known to those skilled in the art (for example, see JP-A-2-189011, JP-A-5-90865, JP-A-1-231412 and JP-A-61-92011). In a SAW device described in JP-A-2-189011, the surface of the piezoelectric substrate having an IDT formed thereon is etched under the condition that the etching rate of the piezoelectric substrate is greater than the etching rate of the IDT, and fine adjustment is performed to lower the frequency. In JP-A-5-90865, JP-A-1-231412 and JP-A-61-92011, similarly, the surface of a piezoelectric substrate is dry-etched with the IDT formed thereon as a mask, such that the frequency of the SAW device is shifted to a low-frequency band.

In a transversal SAW filter, a technique is known in which the surface of a piezoelectric substrate between electrode fingers of an IDT electrode is etched to form grooves, thereby reducing an apparent propagation speed (for example, see JP-A-10-270974). Thus, it is possible to make the electrode finger pitch of the IDT electrode small without changing the preliminary design of the SAW filter, thereby realizing reduction in size of a chip.

In a SAW resonator which excites a shear wave called an SSBW (Surface Skimming Bulk Wave), it is known that an IDT electrode having a standardized electrode thickness $(H/\lambda)$ of $2.0 \leq H/\lambda \leq 4.0\%$ is formed of aluminum on a rotation Y cut quartz crystal substrate in which a cut angle is $-43°$ to $-52°$ and a shear wave propagation direction is a Z'-axis direction (Euler angles $(\phi, \theta, \psi) = (0°, 38 \leq \theta \leq 47, 90°)$), thereby realizing a frequency-temperature characteristic of a cubic curve (for example, see JP-B-1-34411). A shear wave (SH wave) propagates directly below the surface of the piezoelectric substrate in a state where vibration energy is confined directly below the electrode. Thus, the reflection efficiency of the SAW by the reflector is unsatisfactory compared to an ST cut quartz crystal SAW device in which a SAW propagates along the substrate surface, making it difficult to realize reduction in size and a high Q value.

In order to solve this problem, a SAW device is suggested in which an IDT and a grating reflector are formed in the surface of a rotation Y cut quartz crystal substrate having Euler angles $(\phi, \theta, \psi) = (0°, -64° < \theta < 49.3°, 85° \leq \psi \leq 95°)$ to excite an SH wave (for example, see International Publication No. WO2005/099089A1). The SAW device sets the electrode thickness $H/\lambda$ standardized with the SAW wavelength $\lambda$ to $0.04 < H/\lambda < 0.12$, thereby realizing reduction in size, a high Q value, and excellent frequency stability.

In such a SAW device, in order to solve a problem in that the Q value or frequency stability is deteriorated due to stress migration caused by a large electrode thickness, a technique is suggested in which grooves are formed in the quartz crystal substrate between the electrode fingers of the IDT (for example, see JP-A-2006-203408). When the depth of the grooves is Hp and the thickness of a metal film of the IDT is Hm, the electrode thickness $H/\lambda$ standardized with the SAW wavelength $\lambda$ is set to $0.04 < H/\lambda < 0.12$ (where H=Hp+Hm), such that the apparent thickness of the metal film can be made small. Thus, it is possible to suppress a frequency fluctuation due to stress migration at the time of electrical conduction, thereby realizing a SAW device having a high Q value and excellent frequency stability.

During the mass production of SAW devices, when electrode fingers of an IDT are formed in the surface of a quartz crystal substrate by etching, if the thickness of the electrode fingers is large, a variation is likely to occur in the line occupancy (line space ratio) η of the IDT due to side etching. As a result, if a variation occurs in the frequency fluctuation with a change in the temperature of the SAW device, product reliability and quality are damaged. In order to solve this problem, a SAW device is known in which an in-plane rotation ST cut quartz crystal substrate having Euler angles $(\phi, \theta, \psi) = (0°, 95° \leq \theta \leq 155°, 33° \leq |\psi| 46°)$ is used, a SAW stopband upper limit mode is excited, and inter-electrode-finger grooves are formed in the surface of the quartz crystal substrate between electrode fingers of an IDT (for example, see JP-A-2009-225420).

When the frequency-temperature characteristic of the SAW device is a quadratic curve in the operation temperature range, it is difficult to realize minimization of a frequency fluctuation range or an inflection point. Accordingly, a SAW device is suggested in which, in order to obtain a frequency-temperature characteristic of a cubic curve, an IDT electrode is formed on an LST cut quartz crystal substrate through a void layer and a dielectric film to excite a leaky SAW (for example, see Japanese Patent No. 3851336). Japanese Patent No. 3851336 describes that, in a SAW device using a Rayleigh wave, a quartz crystal substrate having a cut angle such that a frequency-temperature characteristic expressed by a cubit curve is realized could not be found.

In an ST cut quartz crystal SAW resonator or the like, in order to increase the Q value without deteriorating an excellent frequency-temperature characteristic, an inclined IDT is known in which an IDT and a reflector are arranged on the surface of a quartz crystal substrate to be inclined at a power flow angle PFA±3° with respect to a SAW phase velocity direction (for example, see Japanese Patent No. 3216137 and JP-A-2005-204275). In the SAW device having the inclined IDT, the IDT and the reflector are arranged so as to cover a SAW phase direction and a vibration energy direction, such that the SAW can be efficiently reflected by the reflector. Thus, it is possible to efficiently perform energy confinement and to further increase the Q value.

When a SAW device is mounted in a package or on a circuit board, a method is widely used in which electrode pads are connected to external terminals using metal wires through solder reflow. At the time of reflow mounting, since a high temperature beyond 200° C. is applied over a short time of several minutes, it is well known that the frequency of the SAW device fluctuates. For this reason, in the related art, the frequency fluctuation is predicted in advance, and then the frequency range of a product is set (for example, see JP-A-2006-13576).

In order to relieve characteristic deterioration, such as frequency fluctuation, due to reflow mounting of a SAW device, a method is known in which an electrode film is formed with a Ti/Al structure, electrically connected in a wafer state, and annealed to form an IDT (for example, see JP-A-2003-283282). A SAW module element is suggested in which, when a piezoelectric/pyroelectric material is used for a piezoelectric substrate, in order to resolve a change in the operation frequency due to heat during reflow mounting or light or electromagnetic waves during a treatment process, a thin film having high resistivity is formed on the surface of the piezoelectric substrate (for example, see JP-A-8-307190).

As described above, many elements are related to the frequency-temperature characteristic of the SAW device, and various studies are conducted for improvement. In particular, in a SAW using a Rayleigh wave, it is considered that an increase in the thickness of the electrode fingers constituting the IDT contributes to the improvement of the frequency-temperature characteristic. If the electrode thickness of the IDT simply increases, there is a problem in that deterioration in frequency stability or the like occurs due to stress migration at the time of electrical conduction or side etching at the time of IDT formation. As a countermeasure, grooves are formed between the electrode fingers of the IDT in the surface of the quartz crystal substrate, and it is effective to suppress a frequency fluctuation by increasing the effective thickness while making the electrode thickness small.

However, in all the SAW devices, excluding the SAW device described in JP-B-1-34411 which excites a leaky SAW, the frequency-temperature characteristic in the operation temperature range is expressed by a quadratic curve, it is not difficult to sufficiently reduce a frequency fluctuation range or to realize an inflection point. For this reason, it may be impossible to sufficiently cope with recent requirements for a SAW device, such as expansion or high-precision performance of an operation temperature range, long-term operation stability in an environment in which temperature undergoes severe changes, and the like.

In the field of information communication, at present, high-speed performance is rapidly advancing. In order to cope with the advancement of high-speed performance, it is anticipated that high-frequency performance from MHz to GHz is required for a SAW device. In many SAW devices of the related art, the IDT electrode thickness H is defined by a value standardized with the SAW wavelength $\lambda$, that is, by a standardized thickness H/$\lambda$. In this case, the IDT electrode film is thinned with the advancement of high-frequency performance of the SAW. Accordingly, frequency changes or metal deterioration in the electrode film occurs due to thermal strain under a high-temperature condition at the time of reflow mounting, the influence of SAW vibration for a long period, changes over time, or the like, and reliability may be degraded. On the contrary, if the electrode thickness is excessively large, stress applied to a film at the time of film formation may increase to cause stress migration, causing extreme frequency fluctuation.

An advantage of some aspects of the invention is that it provides a SAW device, such as a resonator or an oscillator, capable of exhibiting an excellent frequency-temperature characteristic with a very small frequency fluctuation in an operation temperature range, having an excellent environment-resistant characteristic ensuring a stable operation even in an environment in which a temperature varies extremely, and realizing a high Q value.

Another advantage of some aspects of the invention is that it provides a SAW device which reliably copes with higher-frequency performance.

SUMMARY

With regard to a SAW resonator in which an in-plane rotation ST cut quartz crystal substrate is used, an IDT which excites a SAW in a stopband upper end mode is formed on the surface of the quartz crystal substrate, and the surface of the quartz crystal substrate between electrode fingers constituting the IDT is recessed to form grooves, the inventors have verified the relationship between parameters, such as the wavelength $\lambda$ of the SAW, the depth G of the grooves, the electrode thickness H of the IDT, and the line occupancy $\eta$ of the electrode fingers, and the frequency-temperature characteristic. As a result, the inventors have devised a novel SAW resonator which can realize minimization of a frequency fluctuation range and an inflection point in the operation temperature range.

A SAW resonator according to a new embodiment (hereinafter, referred to as a SAW resonator of this embodiment) includes an IDT which is provided on a quartz crystal substrate having Euler angles ($-1.5° \leq \phi \leq 1.5°$, $117° \leq \theta \leq 142°$, $42.79° \leq |\psi| \leq 49.57°$), and excites a SAW in a stopband upper end mode. The quartz crystal substrate between electrode fingers constituting the IDT is depressed to form inter-electrode-finger grooves. When the wavelength of the SAW is $\lambda$, and the depth of the inter-electrode-finger groove is G, the relationship $0.01\lambda \leq G$ is satisfied. When the line occupancy of the IDT is $\eta$, the depth G of the inter-electrode-finger grooves and the line occupancy $\eta$ satisfy the following relationships.

[Equation 1]

$$-2.0000 \times G/\lambda + 0.7200 \leq \eta \leq -2.5000 \times G/\lambda + 0.7775 \text{ where } 0.0100\lambda \leq G \leq 0.0500\lambda \quad (1)$$

[Equation 2]

$$-3.5898 \times G/\lambda + 0.7995 \leq \eta \leq -2.5000 \times G/\lambda + 0.7775 \text{ where } 0.0500\lambda \leq G \leq 0.0695\lambda \quad (2)$$

In the SAW resonator of this embodiment, the depth G of the inter-electrode-finger grooves may satisfy the relationship $0.01\lambda \leq G \leq 0.0695\lambda$. If the depth G of the inter-electrode-finger grooves is set within this range, it is possible to suppress a frequency fluctuation in an operation temperature range (for example, $-40°$ C. to $+85°$ C.) to be very small, and even when a manufacturing variation occurs in the depth of the inter-electrode-finger grooves, it is possible to suppress the shift amount of a resonance frequency between individual SAW resonators within a correctable range.

In the SAW resonator of this embodiment, when the electrode thickness of the IDT is H, the relationship $0 < H \, 0.035\lambda$ may be satisfied. Therefore, a satisfactory frequency-temperature characteristic in an operation temperature range is realized, and deterioration in an environment-resistant characteristic which may occur when the electrode thickness is large is prevented.

In the SAW resonator of this embodiment, the line occupancy $\eta$ may satisfy the following relationship.

[Equation 3]

$$\eta = -1963.05 \times (G/\lambda)^3 + 196.28 \times (G/\lambda)^2 - 6.53 \times (G/\lambda) - 135.99 \times (H/\lambda)^2 + 5.817 \times (H/\lambda) + 0.732 - 99.99 \times (G/\lambda) \times (H/\lambda) \quad (3)$$

Therefore, it is possible to suppress a secondary temperature coefficient of the frequency-temperature characteristic to be small.

In the SAW resonator of this embodiment, the sum of the depth G of the inter-electrode-finger grooves and the electrode thickness H may satisfy the relationship $0.0407\lambda \leq G + H$. Therefore, a high Q value is obtained compared to the related art which uses resonance in a stopband lower end mode with no grooves between electrode fingers.

FIG. 1 shows an example of a SAW resonator of this embodiment. As shown in FIG. 1(A), a SAW resonator 1 of this embodiment has a rectangular quartz crystal substrate 2, and an IDT 3 and a pair of reflectors 4 and 4 which are formed on the principal surface of the quartz crystal substrate.

For the quartz crystal substrate 2, an in-plane rotation ST cut quartz crystal substrate which is expressed by Euler angles ($-1.5° \leq \phi \leq 1.5°$, $117° \leq \theta \leq 142°$, $42.79° \leq |\psi| \leq 49.57°$) is used. Here, the Euler angles will be described. A substrate which is expressed by Euler angles ($0°$, $0°$, $0°$) becomes a Z cut substrate which has a principal surface perpendicular to the Z axis. Of the Euler angles ($\phi$, $\theta$, $\psi$), $\phi$ relates to the first rotation of the Z cut substrate, and is a first rotation angle with the Z axis as a rotation axis. The rotation direction from the +X axis to the +Y axis is defined as a positive rotation angle. Of the Euler angles, θ relates to the second rotation after the first rotation of the Z cut substrate, and is a second rotation angle with the X axis after the first rotation as a rotation axis. The rotation direction from the +Y axis after the first rotation to the +Z axis is defined as a positive rotation angle. The cut plane of the piezoelectric substrate is determined by the first rotation angle φ and the second rotation angle θ. Of the Euler angles, ψ relates to the third rotation after the second rotation of the Z cut substrate, and is a third rotation angle with the Z axis after the second rotation as a rotation axis. The rotation direction from the +X axis after the second rotation to the +Y axis after the second rotation is defined as a positive rotation angle. The SAW propagation direction is expressed by the third rotation angle ψ with respect to the X axis after the second rotation.

As shown in FIG. 2, when three crystal axes perpendicular to quartz crystal, that is, an electrical axis, a mechanical axis, and an optical axis are respectively expressed by the X axis, the Y axis, and the Z axis, the in-plane rotation ST cut quartz crystal substrate is cut from a wafer 5 which has an XZ' plane perpendicular to the Y' axis of the coordinate axes (X, Y', Z') obtained by rotating an XZ plane 5a perpendicular to the Y axis at an angle θ' (°) from the +Z axis to the −Y axis with the X axis as a rotation axis. The quartz crystal substrate 2 is cut and individualized from the wafer 5 along new coordinate axes (X', Y', Z'') at an angle +ψ (or −ψ) (°) from the +X axis to the +Z' axis with the Y' axis as a rotation axis. The direction from the +X axis to the +Z' axis is defined as positive. At this time, the long side (or short side) of the quartz crystal substrate 2 may be arranged along either the X'-axis direction or the Z''-axis direction. The angle θ' and θ of the Euler angles satisfy the relationship θ'=θ−90°.

An IDT 3 has a pair of interdigital transducers 3a and 3b which respectively have a plurality of electrode fingers 6a and 6b, and bus bars 7a and 7b connecting the base portions of the electrode fingers together. The electrode fingers 6a and 6b are arranged such that the extension direction thereof is perpendicular to the propagation direction X' of the SAW which is excited by the IDT. The electrode fingers 6a of the interdigital transducer 3a and the electrode fingers 6b of the interdigital transducer 3b are arranged with a given pitch alternately and at a predetermined interval. As shown in FIG. 1(B), inter-electrode-finger grooves 8 having a given depth are recessed in the surface of the quartz crystal substrate 2 which is exposed between the electrode fingers 6a and 6b by removing the surface through etching or the like.

A pair of reflectors 4 and 4 are arranged outside the IDT 3 with the IDT sandwiched therebetween along the SAW propagation direction X'. The reflectors 4 respectively have a plurality of conductor strips 4a and 4a arranged with a given pitch in the SAW propagation direction X'. Similarly to the electrode fingers of the IDT 3, the conductor strips are arranged such that the extension direction thereof is perpendicular to the SAW propagation direction X'. As shown in FIG. 1(B), inter-conductor-strip grooves 9 having a given depth are recessed in the surface of the quartz crystal substrate 2 which is exposed between the conductor strips 4a and 4a by removing the surface through etching or the like.

In this embodiment, the electrode fingers 6a and 6b and the conductor strips 4a and 4a are formed of a metal film using, for example, Al or an alloy mainly containing Al to have the same thickness H, and may be collectively referred to as electrode fingers. The inter-electrode-finger grooves 8 and the inter-conductor-strip grooves 9 are formed to have the same depth G. Grooves are recessed between the outermost electrode fingers 6a (or 6b) of the IDT 3 and the conductor strips 4a and 4a of the reflectors 4 and 4 adjacent to the electrode fingers by removing the surface of the quartz crystal substrate to have the same depth as the inter-conductor-strip grooves.

The SAW resonator 1 configured as above excites a Rayleigh-type SAW which has vibration displacement components in both the X'-axis direction and the Y'-axis direction of the quartz crystal substrate 2. In the quartz crystal substrate 2 having the above-described Euler angles, the SAW propagation direction is shifted from the X axis serving as the crystal axis of quartz crystal, making it possible to excite the SAW in the stopband upper end mode.

The Euler angles (φ, θ, ψ) of the quartz crystal substrate 2 were selected as follow. In general, the frequency-temperature characteristic of the SAW resonator is expressed by the following expression.

$$\Delta f = \alpha \times (T-T0) + \beta \times (T-T0)^2$$

Here, Δf is a frequency change amount (ppm) between a temperature T and a peak temperature T0, α is a primary temperature coefficient (ppm/° C.), β is a secondary temperature coefficient (ppm/° C.$^2$), T is a temperature, and T0 is a temperature (peak temperature) at which a frequency is maximum. The absolute value of the secondary temperature coefficient β is set to be minimum, preferably, equal to or smaller than 0.01 (ppm/° C.$^2$), and more preferably, substantially zero, such that a frequency-temperature characteristic shows a cubic curve, a frequency fluctuation becomes small even in a wide operation temperature range, thereby obtaining high frequency stability.

First, the Euler angles of the quartz crystal substrate 2 were set to (0°, 123°, ψ), and the relationship between the Euler angle ψ and the depth G of the inter-electrode-finger grooves when the line occupancy η resulting in β=±0.01 (ppm/° C.$^2$) has been obtained was simulated. The Euler angle ψ was appropriately selected such that the absolute value of the secondary temperature coefficient β became 0.01 (ppm/° C.$^2$). As a result, the range of the Euler angle ψ for obtaining the secondary temperature coefficient β of −0.01≤β≤+0.01 under the above-described condition could be determined to 43°<ψ<45°.

As shown in FIG. 1(C), the line occupancy η of the IDT 3 is a value obtained by dividing an electrode finger width L by an electrode finger pitch λ/2(=L+S). FIG. 1(D) illustrates a method of specifying the line occupancy η of the IDT 3 in a trapezoidal cross-section which will be formed when the electrode fingers 6a and 6b of the IDT 3 and the inter-electrode-finger grooves 8 are manufactured by a photolithography technique and an etching technique. In this case, the line occupancy η is calculated on the basis of the electrode finger width L and an inter-electrode-finger groove width S measured at a height half the sum (G+H) of the depth G of the inter-electrode-finger grooves from the bottom of the inter-electrode-finger grooves 8 and the electrode thickness H.

Next, when the cut angle and the quartz crystal substrate 2 and the SAW propagation direction were (0,θ,ψ) in the Euler angle expression, the depth G of the inter-electrode-finger grooves was 0.04λ, the thickness H of the electrode fingers was 0.02λ, and the line occupancy η was 0.6383 by Expression (3), changes in the secondary temperature coefficient β depending on the Euler angle θ were simulated. The Euler angle ψ was appropriately selected in the above-described range 43°<ψ<45° such that the absolute value of the secondary temperature coefficient β was minimum on the basis of the set angle of the angle θ. As a result, if the Euler angle θ was within the range of 117°≤θ≤142°, it was confirmed that, even when the thickness H of the electrode fingers, the depth G of the inter-electrode-finger grooves, and the line occupancy η were changed, the absolute value of the secondary temperature coefficient β was within the range of 0.01 (ppm/° C.$^2$).

Next, the quartz crystal substrate 2 was (φ, 123°, 43.77°) in the Euler angle expression, the depth G of the inter-electrode-finger grooves was 0.04λ, the thickness H of the electrode fingers was 0.02λ, and the line occupancy η was 0.65, changes of the secondary temperature coefficient β depending on the Euler angle φ were simulated. As a result, if the Euler angle φ was within the range of −1.5°≤θ≤+1.5°, it was confirmed that the absolute value of the secondary temperature coefficient β was within the range of 0.01 (ppm/° C.$^2$).

A highly desirable relationship between the Euler angles θ and ψ such that a frequency fluctuation was minimum in an operation temperature range (−40° C. to +85° C.) was obtained by a simulation. In this case, the depth G of the inter-electrode-finger grooves and the thickness H of the electrode fingers were respectively G=0.04λ and H=0.02λ. As a result, the Euler angle ψ increased within the above-described range of the Euler angle θ such that a cubic curve was drawn with an increase in the Euler angle ψ. This relationship can be approximated by the following expression.

$$\psi = 1.19024 \times 10^{-3} \times \theta^3 - 4.48775 \times 10^{-1} \times \theta^2 + 5.64362 \times 10^1 \times \theta - 2.32327 \times 10^3 \pm 1.0 \quad \text{[Equation 4]}$$

Thus, the Euler angle ψ becomes ψ=42.79° with respect to the lower limit value θ=117° of the Euler angle θ, and ψ=49.57° with respect to the upper limit value θ=142° of the Euler angle θ. Therefore, the Euler angle ψ can be set to 42.79°≤ψ≤49.57° within the range of 117°≤θ≤142°.

If the Euler angles of the quartz crystal substrate 2 are set in the above-described manner, the SAW resonator 1 of this embodiment can realize an excellent frequency-temperature characteristic in which the absolute value of the secondary temperature coefficient β is equal to or smaller than 0.01 (ppm/° C.$^2$).

With regard to the SAW resonator 1 of this embodiment, a frequency-temperature characteristic was simulated under the following conditions.
Basic Data of SAW Resonator 1 of this Embodiment
H: 0.02λ
G: change
IDT line occupancy η: 0.6
Reflector line occupancy ηr: 0.8
Euler angles: (0°, 123°, 43.5°)
Number of pairs of IDT: 120
Electrode finger cross width: 40λ (λ=10 μm)
Number of reflectors (per side): 60
Inclination angle of electrode fingers: none The simulation result is shown in FIG. 3. As will be understood from FIG. 3, the frequency-temperature characteristic substantially shows a cubic curve in the operation temperature range (−40 to +85° C.), and the frequency fluctuation range can be suppressed with a very small fluctuation within 20 ppm.

With regard to the SAW resonator 1 showing the frequency-temperature characteristic of FIG. 3, if the frequency, the equivalent circuit constant, and the static characteristic are put together, Table 1 is obtained.

TABLE 1

| | F (MHz) | Q | γ | CI (Ω) | M |
|---|---|---|---|---|---|
| AVG | 318.25 | 13285 | 2476 | 21.8 | 5.4 |

Here, F is a frequency, Q is a Q value, γ is a capacitance ratio, CI is a CI (Crystal Impedance) value, and M is a figure of merit.

The SAW resonator 1 is preferably set such that the frequency ft2 of the stopband upper end of the IDT 3, the frequency fr1 of the stopband lower end of the reflector 4, and the frequency fr2 of the stopband upper end of the reflector 4 satisfy the relationship fr1<ft2<fr2. FIG. 4 shows the SAW reflection characteristics of the IDT 3 and the reflector 4 depending on the frequency. As shown in FIG. 4, if the frequency ft2 is set between the frequency fr1 and the frequency fr2, the reflection coefficient of the reflector 4 becomes larger than the reflection coefficient of the IDT 3 at the frequency ft2. As a result, the SAW in the stopband upper end mode excited from the IDT 3 is reflected from the reflector 4 to the IDT 3 with a higher reflection coefficient. Therefore, the vibration energy of the SAW can be efficiently confined, thereby realizing a low-loss SAW resonator 1.

The relationship between the Q value of the SAW resonator 1 and the magnitude (G+H) of a step formed by the height, that is, thickness H of the electrode fingers 6a and 6b and the depth G of the inter-electrode-finger grooves 8 was verified by a simulation. For comparison, with regard to a SAW resonator of the related art in which no grooves are formed between the electrode fingers and resonance in the stopband upper end mode is used, the relationship between the Q value and the height, that is, thickness of the electrode fingers was simulated under the following conditions.
Basic Data of SAW Resonator of the Related Art
H: change
G: zero (none)
IDT line occupancy η: 0.4
Reflector line occupancy ηr: 0.3
Euler angles (0°, 123°, 43.5°)
Number of pairs of IDT: 120
Electrode finger cross width: 40λ (λ=10 μm)
Number of reflectors (per side): 60
Inclination angle of electrode fingers: none The simulation result is shown in FIG. 5. In FIG. 5, a bold line indicates the SAW resonator 1 of this embodiment, and a thin line indicates the SAW resonator of the related art. As will be understood from FIG. 5, in the SAW resonator 1 of this embodiment, a high Q value can be obtained in a region where the step (G+H) is equal to or greater than 0.0407λ (4.07% λ), compared to the SAW resonator of the related art.

In the SAW resonator of this embodiment, it is necessary to secure high reliability in correspondence with high-frequency performance. In this case, it is considered that the thickness of the electrode fingers of the IDT is preferably defined by a physical thickness, not by the standardized thickness H/λ. The inventors have verified the relationship between the thickness of the electrode fingers of the IDT and a frequency change amount under a high-temperature condition at the time of reflow mounting. The inventors have studied the relationship between electrode resistance and the thickness of the electrode fingers in the IDT. As a result, the inventors have found that, in a SAW device which excites a SAW in a stopband upper end mode, there is a range of the thickness of the electrode fingers for achieving frequency stability and oscillation stability while maintaining a satisfactory frequency-temperature characteristic, and have devised the invention.

A SAW device according to an aspect of the invention includes a quartz crystal substrate having Euler angles (−1.5°≤φ≤1.5°, 117°≤θ≤142°, ψ), and an IDT which has a plurality of electrode fingers on the principal surface of the quartz crystal substrate and excites a surface acoustic wave in a stopband upper end mode. Inter-electrode-finger grooves are recessed in the surface of the quartz crystal substrate between adjacent electrode fingers of the IDT. The wavelength $\lambda$ of the SAW and the depth G of the inter-electrode-finger grooves satisfy the relationship $0.01\lambda \leq G$. An IDT line occupancy $\eta$ and the depth G of the inter-electrode-finger grooves satisfy the following relationships.

[Equation 5]

$$-2.0000 \times G/\lambda + 0.7200 \leq \eta \leq -2.5000 \times G/\lambda + 0.7775 \text{ where } 0.0100\lambda \leq G \leq 0.0500\lambda \quad (1)$$

[Equation 6]

$$-3.5898 \times G/\lambda + 0.7995 \leq \eta \leq -2.5000 \times G/\lambda + 0.7775 \text{ where } 0.0500\lambda \leq G \leq 0.0695\lambda \quad (2)$$

The Euler angle $\psi$ satisfies $|\psi| \neq 90° \times n$ (where n=0, 1, 2, 3), and the thickness H of the electrode fingers of the IDT is within a range of $0.05 \ \mu m \leq H \leq 0.20 \ \mu m$.

If the thickness of the electrode fingers of the IDT is set in the above-described manner, a frequency fluctuation under a high-temperature condition at the time of reflow mounting is reduced while securing and maintaining a satisfactory frequency-temperature characteristic in a wide operation temperature range. Therefore, it is possible to obtain a SAW device having excellent frequency stability and high reliability even during long-term use.

A SAW device according to another aspect of the invention includes a quartz crystal substrate having Euler angles $(-1.5° \leq \phi \leq 1.5°, 117° \leq \theta \leq 142°, 42.79° \leq |\psi| 49.57°)$, an IDT which has a plurality of electrode fingers on the principal surface of the quartz crystal substrate and excites a surface acoustic wave in a stopband upper end mode, and a pair of reflectors which respectively have a plurality of conductor strips and are arranged on both sides of the IDT with the IDT sandwiched therebetween along the propagation direction of the surface acoustic wave. Inter-electrode-finger grooves are recessed in the surface of the quartz crystal substrate between adjacent electrode fingers of the IDT. Inter-conductor-strip grooves are recessed in the surface of the quartz crystal substrate between adjacent conductor strips of the reflectors. The wavelength $\lambda$ of the surface acoustic wave and the depth G of the inter-electrode-finger grooves satisfy the relationship $0.01\lambda \leq G$. An IDT line occupancy $\eta$ and the depth G of the inter-electrode-finger grooves satisfy the following relationship.

[Equation 7]

$$-2.0000 \times G/\lambda + 0.7200 \leq \eta \leq -2.5000 \times G/\lambda + 0.7775 \text{ where } 0.0100\lambda \leq G \leq 0.0500\lambda$$

[Equation 8]

$$-3.5898 \times G/\lambda + 0.7995 \leq \eta \leq -2.5000 \times G/\lambda + 0.7775 \text{ where } 0.0500\lambda \leq G \leq 0.0695\lambda$$

The thickness H of the electrode fingers is within a range of $0.055 \ \mu m \leq H \leq 0.335 \ \mu m$.

If the thickness of the electrode fingers of the IDT is set in the above-described manner, it is possible to reduce the frequency fluctuation under the high-temperature condition at the time of reflow mounting, and to suppress the electrode resistance of the IDT to be small. Therefore, it is possible to maintain and secure a satisfactory frequency-temperature characteristic in a wide operation temperature range obtained by the quartz crystal substrate made of an in-plane rotation ST cut quartz crystal plate having the above-described Euler angles and the inter-electrode-finger grooves, thereby obtaining a SAW device having excellent frequency stability and oscillation stability and high reliability even during long-term use.

The thickness H of the electrode fingers may be within a range of $0.080 \ \mu m \leq H \leq 0.335 \ \mu m$. Therefore, it is possible to secure an excellent frequency-temperature characteristic expressed by a cubic curve in a wide operation temperature range, and to realize a SAW device which is stable during long-term use and has a very small frequency fluctuation.

The IDT line occupancy $\eta$ may satisfy the following relationship.

[Equation 9]

$$\eta = -1963.05 \times (G/\lambda)^3 + 196.28 \times (G/\lambda)^2 - 6.53 \times (G/\lambda) - 135.99 \times (H/\lambda)^2 + 5.817 \times (H/\lambda) + 0.732 - 99.99 \times (G/\lambda) \times (H/\lambda)$$

Therefore, it is possible to suppress the secondary temperature coefficient of the frequency-temperature characteristic smaller, thereby obtaining an excellent frequency-temperature characteristic of a cubic curve having a smaller frequency fluctuation.

As the thickness of the electrode fingers increases, a manufacturing variation in the IDT line occupancy $\eta$ tends to have an increasing influence on the electrical characteristic of the SAW resonator, in particular, the resonance frequency. When the inventors have confirmed through experimentation or the like, when the thickness H of the electrode fingers is within a range of Equations 5 and 6, that is, within a range of Expressions (1) and (2), a manufacturing variation in the IDT line occupancy $\eta$ is within $\pm 0.04$. However, if $H > 0.035\lambda$, there is an increasing possibility that a manufacturing variation exceeds $\pm 0.04$. Thus, if the thickness H of the electrode fingers is within a range of Expressions (1) and (2), and the IDT line occupancy $\eta$ is within $\pm 0.04$, it is possible to a SAW device having a small secondary temperature coefficient $\beta$ within a range of the $\eta$ value obtained by adding a tolerance of $\pm 0.04$ to Expression (3) of Equation 9 as in the following expression.

[Equation 10]

$$-1963.05 \times (G/\lambda)^3 + 196.28 \times (G/\lambda)^2 - 6.53 \times (G/\lambda) - 135.99 \times (H/\lambda)^2 + 5.817 \times (H/\lambda) + 0.732 - 99.99 \times (G/\lambda) \times (H/\lambda) - 0.04 \leq \eta \leq -1963.05 \times (G/\lambda)^3 + 196.28 \times (G/\lambda)^2 - 6.53 \times (G/\lambda) - 135.99 \times (H/\lambda)^2 + 5.817 \times (H/\lambda) + 0.732 - 99.99 \times (G/\lambda) \times (H/\lambda) + 0.04$$

The sum of the depth G of the inter-electrode-finger grooves and the thickness H of the electrode fingers may satisfy $0.0407\lambda \leq G + H$. Therefore, when resonance in a stopband upper end mode is used, a high Q value is obtained compared to a SAW resonator of the related art which uses resonance in a stopband lower end mode with no grooves between the electrode fingers of the IDT.

The SAW device may further include a pair of reflectors which respectively have a plurality of conductor strips on the principal surface of the quartz crystal substrate, and are arranged on both sides of the IDT with the IDT sandwiched therebetween along the SAW propagation direction, and inter-conductor-strip grooves which are recessed in the surface of the quartz crystal substrate between adjacent conductor strips of the reflectors. The angle between a first direction perpendicular to the electrode fingers and the conductor strips and an electronic axis of the quartz crystal substrate may be the Euler angle $\psi$ of the quartz crystal substrate, at least a part of the IDT and the reflectors may be arranged in a second direction intersecting the first direction at an angle $\delta$, and the angle $\delta$ may be set within a range of a power flow angle $\pm 1°$ of the quartz crystal substrate. Therefore, it is possible to improve the Q value.

The SAW device may further include an oscillation circuit which drives the IDT. Therefore, it is possible to obtain a SAW oscillator having a very small frequency fluctuation in a wide operation temperature range, a low CI value, excellent oscillation stability, and high reliability.

According to another aspect of the invention, an electronic apparatus and a sensor apparatus include the above-described SAW device. Therefore, an electronic apparatus and a sensor apparatus which stably exhibit satisfactory performance in a wide operation temperature range with high reliability.

DETAILED DESCRIPTION

Figure 1A:
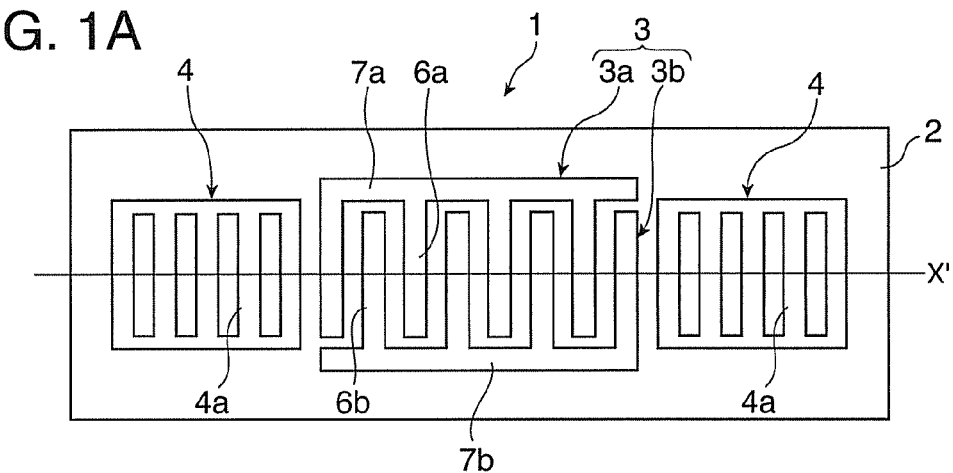
FIG. 1(A) is a plan view showing the configuration of a SAW resonator of this embodiment.
Figure 1B:
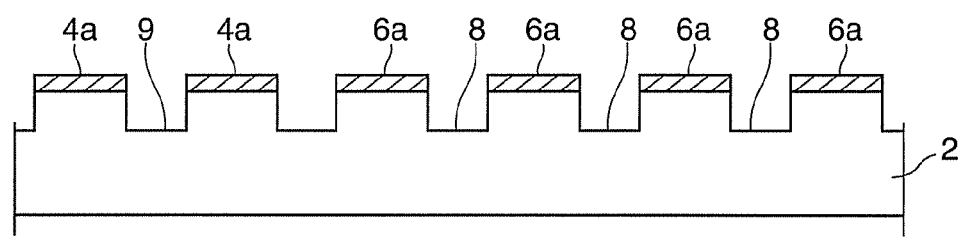
FIG. 1(B) is a partial enlarged longitudinal sectional view.
Figure 1C:
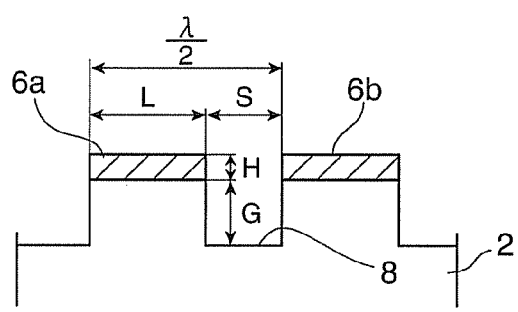
FIG. 1(C) is a partial enlarged view of FIG. 1(B)
Figure 1D:
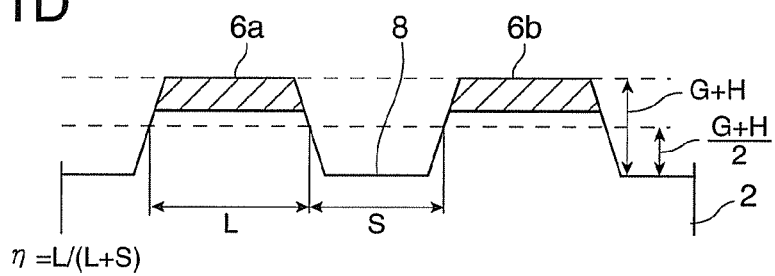
FIG. 1(D) is a diagram showing the sectional shape of a groove portion of FIG. 1(C) which is formed by photolithography and etching techniques.
Figure 2:
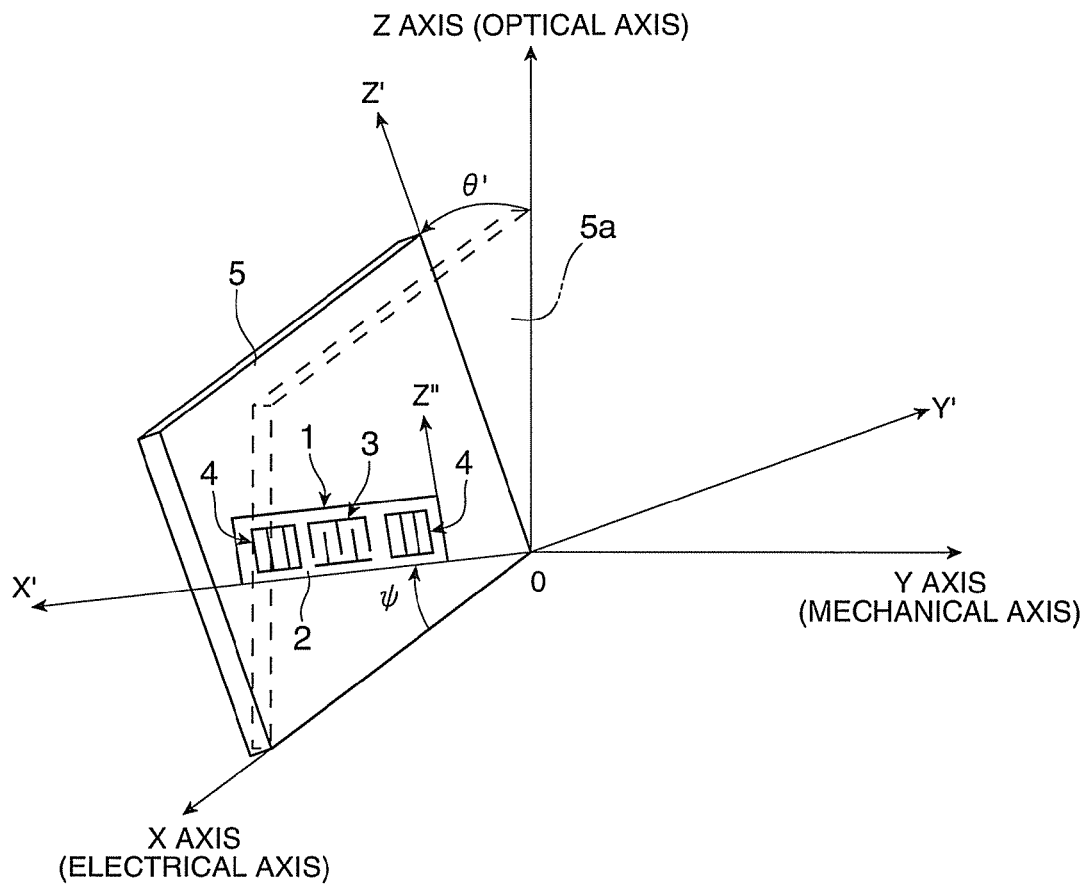
FIG. 2 is an explanatory view schematically showing a quartz crystal substrate of the SAW resonator of FIG. 1.
Figure 3:
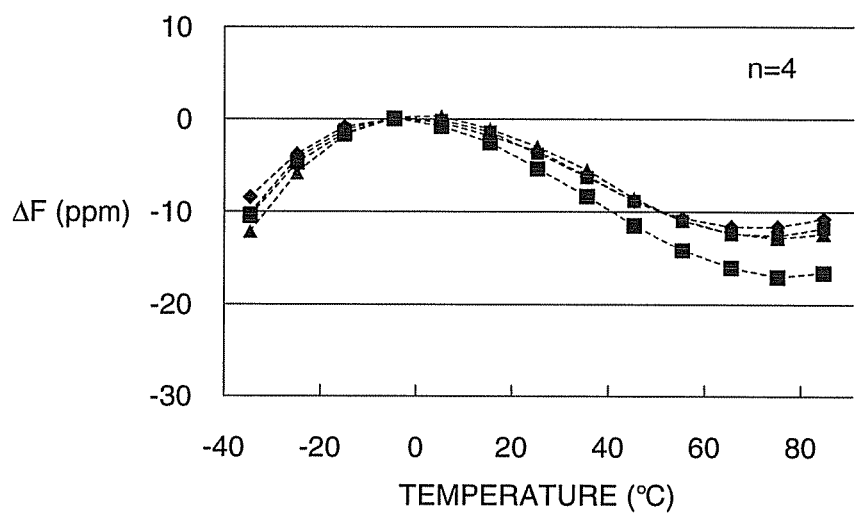
FIG. 3 is a diagram showing the frequency-temperature characteristic of the SAW resonator of FIG. 1.
Figure 4:
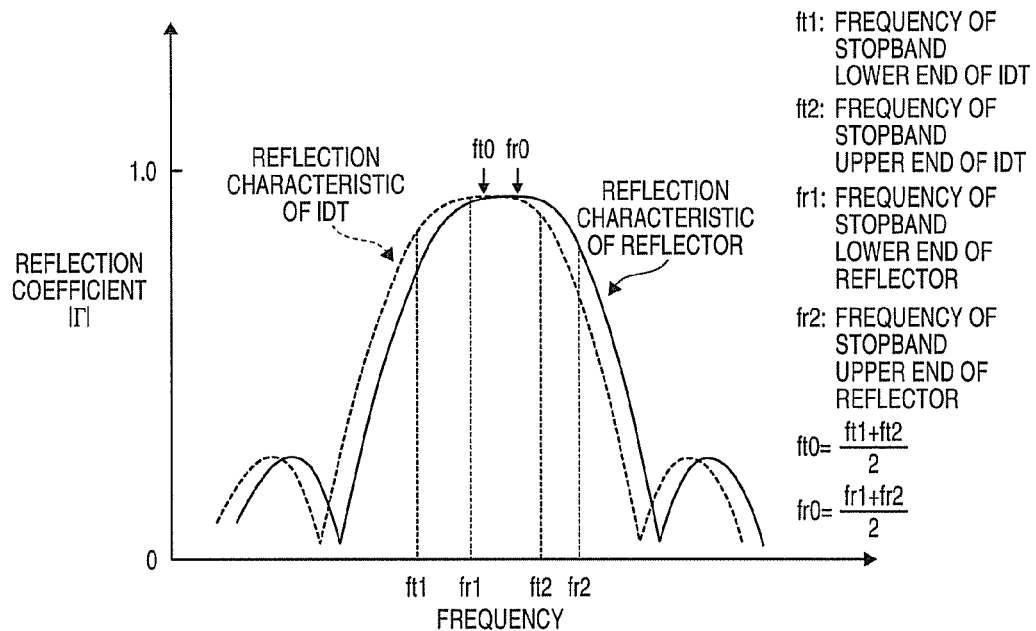
FIG. 4 is a diagram showing the SAW reflection characteristics of an IDT and a reflector in the SAW resonator of FIG. 1.
Figure 5:
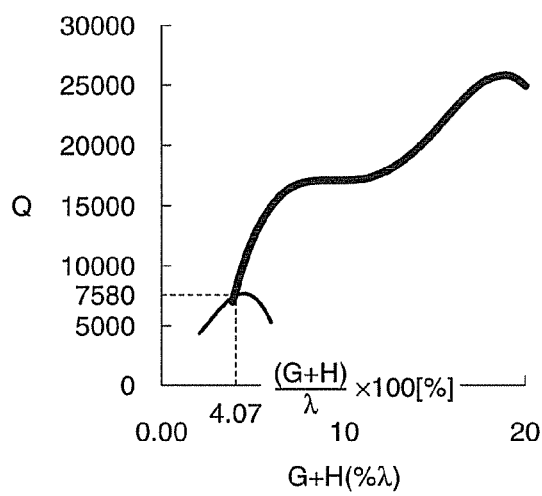
FIG. 5 is a diagram showing the relationship between an inter-electrode-finger step and and a Q value in the SAW resonator of FIG. 1.

Hereinafter, preferred examples of the invention will be described in detail with reference to the accompanying drawings. In the accompanying drawings, the same or similar constituent elements are represented by the same or similar reference numerals.

A SAW resonator which is a first example of a SAW device according to the invention has the same basic configuration as the SAW resonator 1 shown in FIG. 1, and description thereof will be provided with reference to FIG. 1. That is, the SAW resonator 1 of this example has a rectangular quartz crystal substrate 2, and an IDT 3 and a pair of reflectors 4 and 4 which are formed on the principal surface of the quartz crystal substrate. The quartz crystal substrate uses a quartz crystal substrate having Euler angles $(-1.5° \leq \phi \leq 1.5°, 117° \leq \theta \leq 142°, \psi)$. The Euler angle $\psi$ is set such that $|\psi| \neq 90° \times n$ (where n=0, 1, 2, 3) is satisfied.

The IDT 3 has a pair of interdigital transducers 3a and 3b which respectively have a plurality of electrode fingers 6a and 6b, and bus bars 7a and 7b connecting the base portions of the electrode fingers 6a and 6b. The electrode fingers 6a and 6b are arranged such that the extension direction thereof is perpendicular to the propagation direction of a SAW which is excited by the IDT. The electrode fingers 6a of the interdigital transducer 3a and the electrode fingers 6b of the interdigital transducer 3b are arranged with a given pitch alternately and at a predetermined interval. Inter-electrode-finger grooves 8 having a given depth are recessed in the surface of the quartz crystal substrate 2 exposed between the electrode fingers 6a and 6b by removing the surface through etching or the like.

A pair of reflectors 4 and 4 are arranged on both sides of the IDT 3 with the IDT sandwiched therebetween along the SAW propagation direction. The reflectors 4 respectively have a plurality of conductor strips (electrode fingers) 4a and 4a arranged with a given pitch in the SAW propagation direction. The conductor strips are arranged such that the extension direction thereof is perpendicular to the SAW propagation direction. Inter-conductor-strip grooves 9 are recessed in the surface of the quartz crystal substrate 2 exposed between the conductor strips 4a and 4a by removing the surface through etching or the like.

The electrode fingers and the conductor strips are formed of a metal film using, for example, Al or an alloy mainly containing Al to have the same thickness H. The inter-electrode-finger grooves and the inter-conductor-strip grooves are formed to have the same depth G. Similarly, grooves having the same depth as the inter-electrode-finger grooves are formed between the innermost conductor strips of the reflectors 4 and 4 and the outermost electrode fingers 6a (or 6b) of the IDT 3 at a predetermined interval by removing the surface of the quartz crystal substrate.

With this configuration, the SAW resonator 1 excites a Rayleigh-type SAW which has vibration displacement components in both the X'-axis direction and the Y'-axis direction of the quartz crystal substrate 2. With the use of the quartz crystal substrate 2 having the above-described Euler angles, the SAW propagation direction is shifted from the X axis which is the crystal axis of quartz crystal, thereby exciting the SAW in the stopband upper end mode.

In a certain example, as described above, the Euler angle $\psi$ of the quartz crystal substrate 2 is set so as to satisfy the $|\psi| \neq 90° \times n$ (where n=0, 1, 2, 3). In this case, it is preferable that the thickness H of the electrode fingers 6a and 6b is set to be within a range of $0.05 \ \mu m \leq H \leq 0.20 \ \mu m$. Thus, it is possible to maintain and secure a satisfactory frequency-temperature characteristic by vibration in the stopband upper end mode in a wide operation temperature range, and to reduce a frequency fluctuation under a high-temperature condition at the time of reflow mounting.

In another example, the Euler angle $\psi$ of the quartz crystal substrate 2 is set so as to satisfy $42.79° \leq |\psi| \leq 49.57°$. In this case, it is preferable that the thickness H of the electrode fingers 6a and 6b is set to be within a range of $0.055 \ \mu m \leq H \leq 0.255 \ \mu m$. Thus, it is possible to reduce a frequency fluctuation under a high-temperature condition at the time of reflow mounting, and to suppress the electrode resistance of the IDT to be small. Therefore, a satisfactory frequency-temperature characteristic is maintained and secured in a wide operation temperature range, thereby obtaining a SAW resonator having excellent frequency stability and oscillation stability and high reliability even during long-term use.

In this case, the thickness H of the electrode fingers can be set to be within a range of $0.080 \ \mu m \leq H \leq 0.335 \ \mu m$. Thus, it is possible to secure an excellent frequency-temperature characteristic expressed by a cubic curve in a wide operation temperature range, thereby realizing a SAW resonator which is stable even during long-term use and has a very small frequency fluctuation. If the electrode thickness becomes larger, it is possible to further increase bonding strength when bonding wires are bonded.

Figure 6:
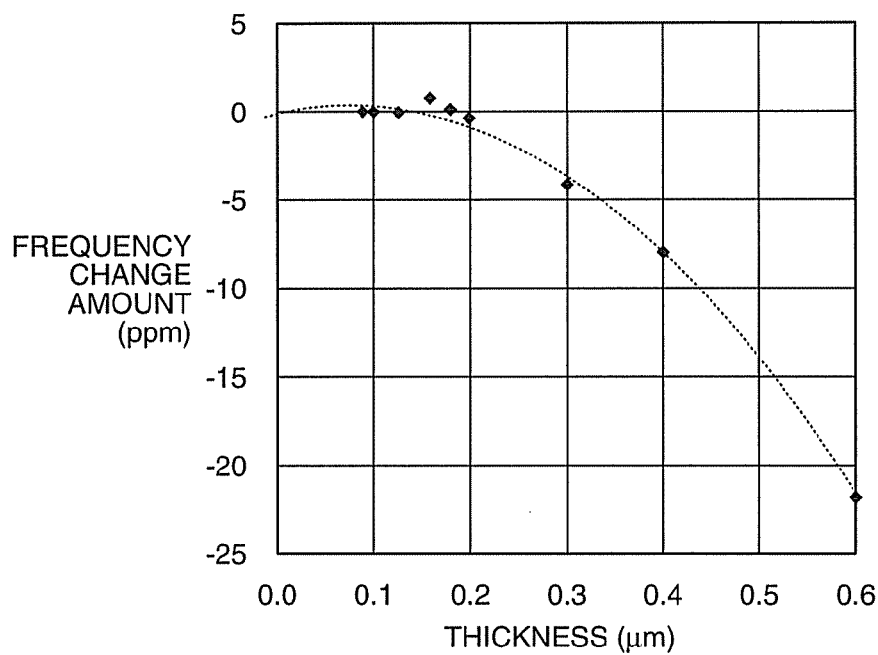
FIG. 6 is a diagram showing the relationship between an IDT electrode thickness and a frequency fluctuation under a high-temperature condition at the time of reflow mounting in a first example of a SAW resonator according to the invention.

With regard to the SAW resonator 1 of this example, the relationship between the thickness H ($\mu$m) of the electrode fingers of the IDT and the frequency change amount (ppm) under the high-temperature condition at the time of reflow mounting was verified by a simulation. The result is shown in FIG. 6. From the analysis of the result of FIG. 6, it was understood that, when the electrode finger thickness H is x, and the frequency change amount is y, it was understood that the relationship of the following relationship was established.

$$y = -86.15x^2 + 15.82x - 0.44$$

It is preferable that the frequency change amount is suppressed to be within ±5 ppm so as to maintain and secure a satisfactory frequency-temperature characteristic by vibration in the stopband upper end mode. From FIG. 6 and the analysis result, it was confirmed that, if the electrode finger thickness H was set in a range of 0.055 µm≤H≤0.335 µm, the frequency change amount within ±5 ppm could be attained. It was also confirmed that, if the electrode finger thickness H was set in a range of 0.080 µm≤H≤0.335 µm to suppress the frequency change amount to be smaller, an excellent frequency-temperature characteristic of a cubic curve could be secured. In particular, it was confirmed that, when the electrode finger thickness H was set in a range of 0.05 µm≤H≤0.20 µm, the frequency change amount could be suppressed to be minimum, thereby substantially securing and maintaining an excellent frequency-temperature characteristic in an original state.

Figure 7:
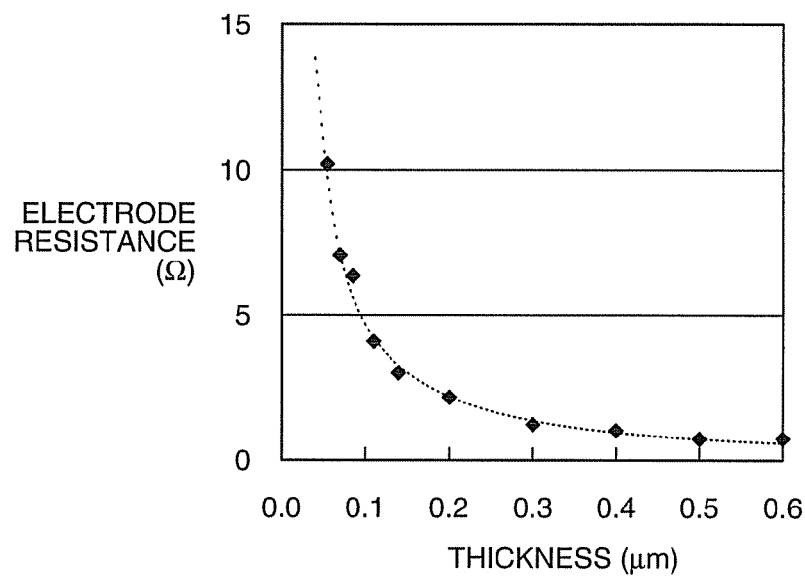
FIG. 7 is a diagram showing the relationship between an IDT electrode thickness and a CI value in the first example.

With regard to the SAW resonator 1 of this example, the relationship between the electrode resistance (Ω) of the IDT and the electrode finger thickness H (µm) was verified by a simulation. The result is shown in FIG. 7. From the analysis of the result of FIG. 7, when the electrode finger thickness H is x, and electrode resistance is y, it was understood that the relationship of the following expression was established.

$$y = -0.2874x^{-1.223}$$

In general, a SAW resonator has series resistance of maximum 20Ω, excluding the electrode resistance of the IDT. If the whole series resistance of the SAW resonator exceeds 30Ω, when the SAW resonator is used as an oscillator, stable oscillation is not easily performed. Thus, it is preferable to suppress the electrode resistance of the IDT to be lower than 10Ω. From FIG. 7 and the analysis result, it was confirmed that, if the electrode finger thickness H was set to be equal to or greater than 0.05 µm, the electrode resistance equal to or lower than 10Ω could be attained.

Figure 8A:
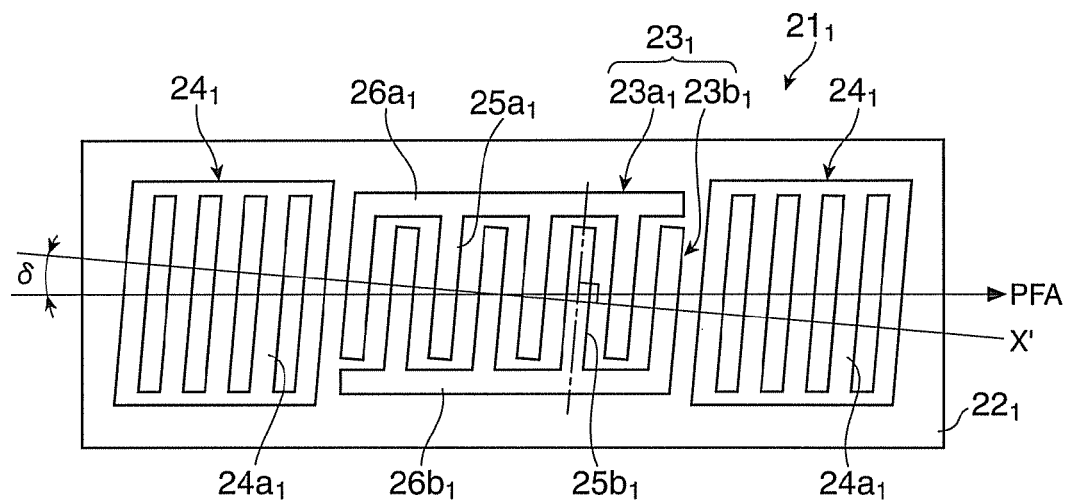
FIGS. 8(A) and 8(B) are plan views showing SAW resonators having inclined IDTs of different structures according to a second example of the invention.

FIGS. 8(A) and (B) show a second example of the SAW resonator according to the invention, and have different inclined IDT structures. As in the first example, a SAW resonator $21_1$ of FIG. 8(A) has an inclined IDT $23_1$ and a pair of reflectors $24_1$ and $24_1$ on the principal surface of a quartz crystal substrate $22_1$ expressed by Euler angles (−1.5°≤φ≤1.5°, 117°≤θ≤142°, 42.79°≤|ψ|≤49.57°). The quartz crystal substrate $22_1$ is such that the longitudinal direction thereof is aligned in a direction inclined by a power flow angle (PFA) δ° in the propagation direction of energy with respect to the X' axis which is the propagation direction of the phase velocity of the SAW excited by the IDT $23_1$.

The IDT $23_1$ has a pair of interdigital transducers $23a_1$ and $23b_1$ which respectively have a plurality of electrode fingers $25a_1$ and $25b_1$, and bus bars $26a_1$ and $26b_1$ connecting the base portions of the electrode fingers. A pair of reflectors $24_1$ and $24_1$ are arranged on both sides of the IDT $23_1$ with the IDT sandwiched therebetween along the SAW propagation direction, and respectively have a plurality of conductor strips $24a_1$ and $24a_1$ arranged in the SAW propagation direction. The electrode fingers $25a_1$ and $25b_1$ and the conductor strips $24a_1$ are arranged such that the extension direction thereof is perpendicular to the X' axis inclined at the power flow angle (PFA) δ°.

As in the first example, inter-electrode-finger grooves are recessed in the surface of the quartz crystal substrate $22_1$ exposed between the electrode fingers $25a_1$ and $25b_1$. Similarly, inter-conductor-strip grooves are recessed in the surface of the quartz crystal substrate $22_1$ between the conductor strips $24a_1$ and $24a_1$.

If at least a part of the IDT and the reflectors are arranged in a direction intersecting the X'-axis direction at the power flow angle δ, the SAW device $21_2$ exhibits the same functional effects as in the first example, thereby further increasing the Q value. Thus, a lower-loss SAW resonator is realized.

Figure 8B:
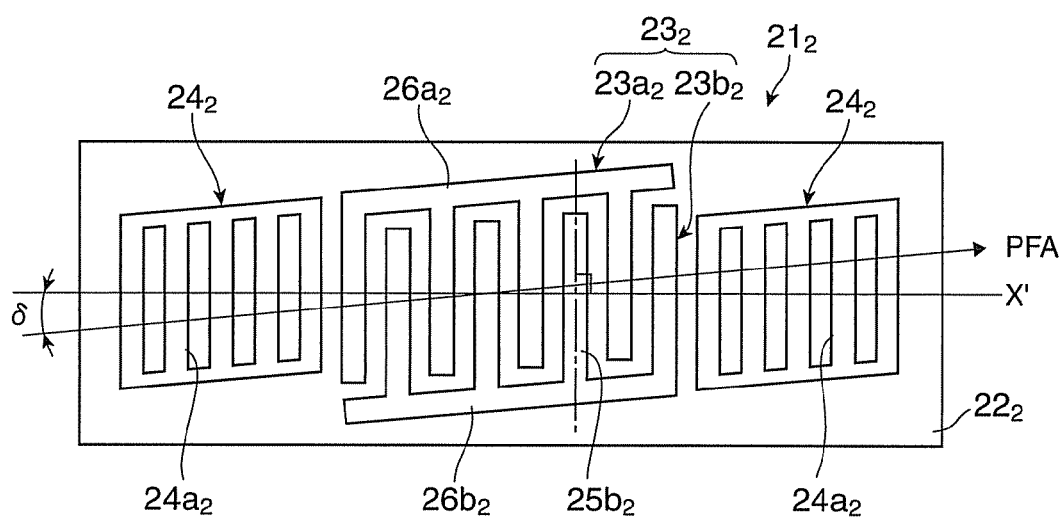

A SAW resonator $21_2$ of FIG. 8(B) has an inclined IDT $23_2$ and a pair of reflectors $24_2$ and $24_2$ having a different configuration from FIG. 8(A) on the principal surface of the quartz crystal substrate $22_2$. The quartz crystal substrate $22_2$ is such that the longitudinal direction thereof is aligned along the X' axis which is the propagation direction of the phase velocity of the SAW excited by the IDT $23_2$.

The IDT $23_2$ has a pair of interdigital transducers $23a_2$ and $23b_2$ which respectively have a plurality of electrode fingers $25a_2$ and $25b_2$, and base bars $26a_2$ and $26b_2$ connecting the bus portions of the electrode fingers. A pair of reflectors $24_2$ and $24_2$ are arranged on both sides of the IDT $23_2$ with the IDT sandwiched therebetween along the SAW propagation direction, and respectively have a plurality of conductor strips $24a_2$ and $24a_2$ arranged in the SAW propagation direction. The electrode fingers $25a_2$ and $25b_2$ and the conductor strip $24a_2$ are arranged such that the extension direction thereof is perpendicular to the X' axis, and the bus bars $26a_2$ and $26b_2$ are aligned in a direction inclined at the power flow angle (PFA) δ° from the X' axis.

As in the first example, inter-electrode-finger grooves are recessed in the surface of the quartz crystal substrate $22_2$ exposed between the electrode fingers $25a_2$ and $25b_2$. Similarly, inter-conductor-strip grooves are recessed in the surface of the quartz crystal substrate $22_2$ between the conductor strips $24a_2$ and $24a_2$.

In the SAW resonator $21_2$ of this example, if at least a part of the IDT and the reflectors is arranged in a direction intersecting the X'-axis direction at the power flow angle δ in the above-described manner, a functional effect of realizing a satisfactory frequency-temperature characteristic and a high Q value is exhibited, thereby further increasing the Q value. Thus, a lower-loss SAW resonator is realized.

Figure 9A:
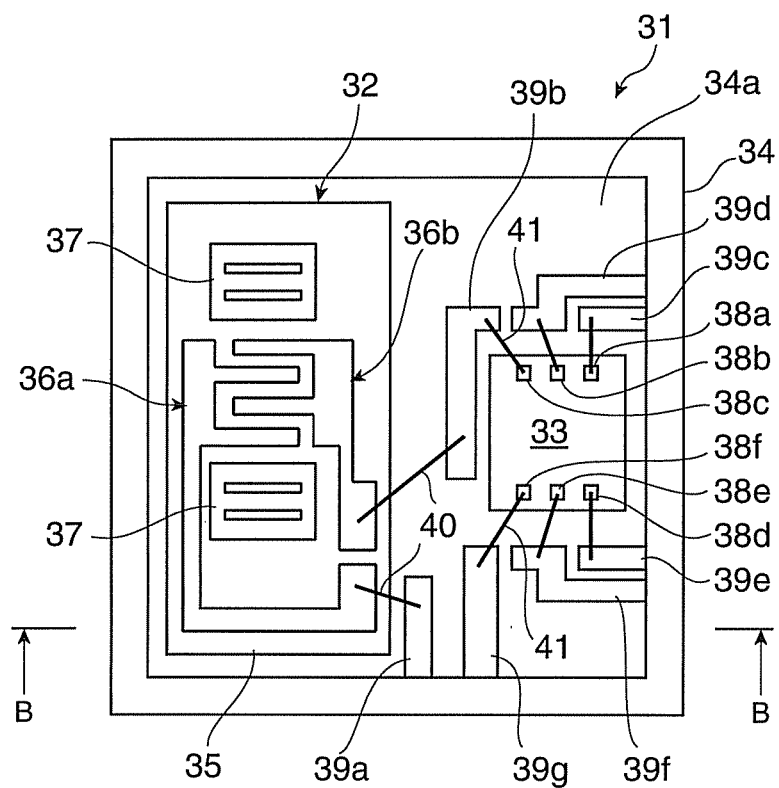
FIG. 9(A) is a plan view showing a SAW oscillator according to the second example of the invention, and (B) is a longitudinal sectional view taken along the line B-B.
Figure 9B:
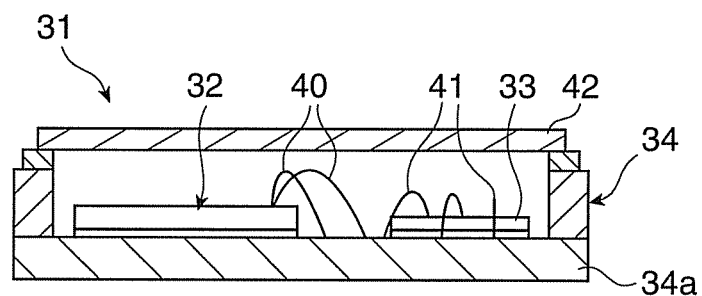

The invention may be applied to an oscillator in which the SAW resonator of this embodiment and an oscillation circuit are incorporated. FIGS. 9(A) and (B) show the configuration of an example of a SAW oscillator which is a second example of a SAW device according to the invention. A SAW oscillator 31 of this example includes a SAW resonator 32 of this embodiment, an IC (integrated circuit) 33 which serves as an oscillation circuit to drive and control the SAW resonator, and a package 34 which accommodates the SAW resonator 32 and the IC 33. The SAW resonator 32 and the IC 33 are surface-mounted on a bottom plate 34a of the package 34.

The SAW resonator 32 has the same configuration of the SAW resonator 11 of the first example. The SAW resonator 32 has a quartz crystal substrate 35 which is expressed by the same Euler angles as in the first example, and an IDT having a pair of interdigital transducers 36a and 36b and a pair of reflectors 37 and 37 formed on the surface of the quartz crystal substrate 35. Electrode pads 38a to 38f are provided in the upper surface of the IC 33. Electrode patterns 39a to 39g are formed on the bottom plate 34a of the package 34. The interdigital transducers 36a and 36b of the SAW resonator 32 and the electrode pads 38a to 38f of the IC 33 are electrically connected to the corresponding electrode patterns 39a to 39g by bonding wires 40 and 41. The package 34 in which the SAW resonator 32 and the IC 33 is sealed airtight by a lid 42 bonded to the upper part of the package 34.

The SAW oscillator 31 of this example includes the SAW resonator of this embodiment, and has an excellent frequency-temperature characteristic with a very small frequency fluctuation in a wide operation temperature range and a high Q value. Therefore, it is possible to perform a stable oscillation operation and to realize reduction in power consumption because of low impedance. As a result, a SAW oscillator is obtained which copes with high-frequency and high-precision performance based on recent high-speed information communication, and includes an environment-resistant characteristic such that, even when a temperature varies extremely, a stable operation is ensured for a long period.

The invention is not limited to the foregoing examples, and various modifications or changes may be made within the technical scope. For example, with regard to the electrode structure of the IDT, in addition to the foregoing examples, various known configurations may be used. The invention may also be applied to a SAW device other than the above-described SAW resonator and SAW oscillator.

The SAW device of this embodiment may also be widely applied to various electronic apparatuses, such as a mobile phone, a hard disk, a personal computer, a receiver tuner of BS and CS broadcasts, various processing apparatuses for a high-frequency signal or an optical signal which propagates through a coaxial cable or an optical cable, a server network apparatus which requires high-frequency and high-precision clock (low jitter and low phase noise) in a wide temperature range, various electronic apparatuses such as a wireless communication apparatus, and various sensor apparatuses, such as a pressure sensor, an acceleration sensor, and a rotation speed sensor.

The entire disclosure of Japanese Patent Application No. 2010-201750, filed Sep. 9, 2010 is expressly incorporated by reference herein.

The invention claimed is:

1. A surface acoustic wave device comprising:
a quartz crystal substrate having Euler angles ($-1.5° \leq \phi \leq 1.5°$, $117° \leq \theta \leq 142°$, $\psi$); and
an IDT which has a plurality of electrode fingers on the principal surface of the quartz crystal substrate and excites a surface acoustic wave in a stopband upper end mode,
wherein inter-electrode-finger grooves are recessed in the surface of the quartz crystal substrate between adjacent electrode fingers of the IDT,
the wavelength $\lambda$ of the surface acoustic wave and the depth G of the inter-electrode-finger grooves satisfy the relationship $0.01\lambda \leq G$,
an IDT line occupancy $\eta$ and the depth G of the inter-electrode-finger groove satisfy the following relationships:

$-2.0000 \times G/\lambda + 0.7200 \leq \eta \leq -2.5000 \times G/\lambda + 0.7775$ where $0.0100\lambda \leq G \leq 0.0500\lambda$;

$-3.5898 \times G/\lambda + 0.7995 \leq \eta \leq -2.5000 \times G/\lambda + 0.7775$ where $0.0500\lambda \leq G \leq 0.0695\lambda$;

the Euler angle $\psi$ satisfies $|\psi| \neq 90° \times n$ (where n=0, 1, 2, 3), and
the thickness H of the electrode fingers is within a range of $0.05 \, \mu m \leq H \leq 0.20 \, \mu m$.

2. A surface acoustic wave device comprising:
a quartz crystal substrate having Euler angles ($-1.5° \leq \phi \leq 1.5°$, $117° \leq \theta \leq 142°$, $42.79° \leq |\psi| \leq 49.57°$); and
an IDT which has a plurality of electrode fingers on the principal surface of the quartz crystal substrate and excites a surface acoustic wave in a stopband upper end mode,
wherein inter-electrode-finger grooves are recessed in the surface of the quartz crystal substrate between adjacent electrode fingers of the IDT,
the wavelength $\lambda$ of the surface acoustic wave and the depth G of the inter-electrode-finger grooves satisfy the relationship $0.01\lambda \leq G$,
an IDT line occupancy $\eta$ and the depth G of the inter-electrode-finger groove satisfy the following relationships:

$-2.0000 \times G/\lambda + 0.7200 \leq \eta \leq -2.5000 \times G/\lambda + 0.7775$ where $0.0100\lambda \leq G \leq 0.0500\lambda$;

$-3.5898 \times G/\lambda + 0.7995 \leq \eta \leq -2.5000 \times G/\lambda + 0.7775$ where $0.0500\lambda \leq G \leq 0.0695\lambda$; and the thickness H of the electrode fingers is within a range of $0.055 \, \mu m \leq H \leq 0.335 \, \mu m$.

3. The surface acoustic wave device according to claim 2, wherein the thickness H of the electrode fingers is within a range of $0.080 \, \mu m \leq H \leq 0.335 \, \mu m$.

4. The surface acoustic wave device according to claim 2, wherein the IDT line occupancy $\eta$ satisfies the following relationship:

$-1963.05 \times (G/\lambda)^3 + 196.28 \times (G/\lambda)^2 - 6.53 \times (G/\lambda) - 135.99 \times (H/\lambda)^2 + 5.817 \times (H/\lambda) + 0.732 - 99.99 \times (G/\lambda) \times (H/\lambda) - 0.04 \leq \eta \leq -1963.05 \times (G/\lambda)^3 + 196.28 \times (G/\lambda)^2 - 6.53 \times (G/\lambda) - 135.99 \times (H/\lambda)^2 + 5.817 \times (H/\lambda) + 0.732 - 99.99 \times (G/\lambda) \times (H/\lambda) + 0.04$.

5. The surface acoustic wave device according to claim 2, wherein the sum of the depth G of the inter-electrode-finger grooves and the thickness H of the electrode fingers satisfy $0.0407\lambda \leq G + H$.

6. The surface acoustic wave device according to claim 4, wherein the sum of the depth G of the inter-electrode-finger grooves and the thickness H of the electrode fingers satisfies $0.0407\lambda \leq G + H$.

7. The surface acoustic wave device according to claim 2, further comprising:
a pair of reflectors which respectively have a plurality of conductor strips on the principal surface of the quartz crystal substrate and are arranged on both sides of the IDT with the IDT sandwiched therebetween along the propagation direction of the surface acoustic wave; and
inter-conductor-strip grooves which are recessed in the surface of the quartz crystal substrate between adjacent conductor strips of the reflectors,
wherein an angle between a first direction perpendicular to the electrode fingers and the conductor strips and the electronic axis of the quartz crystal substrate is the Euler angle $\psi$,
at least a part of the IDT and the reflectors is arranged in a second direction intersecting the first direction at an angle $\delta$, and
the angle $\delta$ is within a range of a power flow angle $\pm 1°$ of the quartz crystal substrate.

8. The surface acoustic wave device according to claim 4, further comprising:
a pair of reflectors which respectively have a plurality of conductor strips on the principal surface of the quartz crystal substrate and are arranged on both sides of the IDT with the IDT sandwiched therebetween along the propagation direction of the surface acoustic wave; and inter-conductor-strip grooves which are recessed in the surface of the quartz crystal substrate between adjacent conductor strips of the reflectors, wherein an angle between a first direction perpendicular to the electrode fingers and the conductor strips and the electronic axis of the quartz crystal substrate is the Euler angle ψ, at least a part of the IDT and the reflectors is arranged in a second direction intersecting the first direction at an angle δ, and the angle δ is within a range of a power flow angle ±1° of the quartz crystal substrate.

9. The surface acoustic wave device according to claim 5, further comprising:

a pair of reflectors which respectively have a plurality of conductor strips on the principal surface of the quartz crystal substrate and are arranged on both sides of the IDT with the IDT sandwiched therebetween along the propagation direction of the surface acoustic wave; and inter-conductor-strip grooves which are recessed in the surface of the quartz crystal substrate between adjacent conductor strips of the reflectors, wherein an angle between a first direction perpendicular to the electrode fingers and the conductor strips and the electronic axis of the quartz crystal substrate is the Euler angle ψ, at least a part of the IDT and the reflectors is arranged in a second direction intersecting the first direction at an angle δ, and the angle δ is within a range of a power flow angle ±1° of the quartz crystal substrate.

10. The surface acoustic wave device according to claim 6, further comprising:

a pair of reflectors which respectively have a plurality of conductor strips on the principal surface of the quartz crystal substrate and are arranged on both sides of the IDT with the IDT sandwiched therebetween along the propagation direction of the surface acoustic wave; and, inter-conductor-strip grooves which are recessed in the surface of the quartz crystal substrate between adjacent conductor strips of the reflectors, wherein an angle between a first direction perpendicular to the electrode fingers and the conductor strips and the electronic axis of the quartz crystal substrate is the Euler angle ψ, at least a part of the IDT and the reflectors is arranged in a second direction intersecting the first direction at an angle δ, and the angle δ is within a range of a power flow angle ±1° of the quartz crystal substrate.

11. The surface acoustic wave device according to claim 1, further comprising:

an IC which drives the IDT.

12. The surface acoustic wave device according to claim 4, further comprising:

an IC which drives the IDT.

13. The surface acoustic wave device according to claim 5, further comprising:

an IC which drives the IDT.

14. An electronic apparatus comprising:

the surface acoustic wave device according to claim 1.

15. A sensor apparatus comprising:

the surface acoustic wave device according to claim 1.

16. The surface acoustic wave device according to claim 3, wherein the IDT line occupancy η satisfies the following relationship:

$$-1963.05 \times (G/\lambda)^3 + 196.28 \times (G/\lambda)^2 - 6.53 \times (G/\lambda) - 135.99 \times (H/\lambda)^2 + 5.817 \times (H/\lambda) + 0.732 - 99.99 \times (G/\lambda) \times (H/\lambda) - 0.04 \leq \eta \leq -1963.05 \times (G/\lambda)^3 + 196.28 \times (G/\lambda)^2 - 6.53 \times (G/\lambda) - 135.99 \times (H/\lambda)^2 + 5.817 \times (H/\lambda) + 0.732 - 99.99 \times (G/\lambda) \times (H/\lambda) - 0.04.$$

17. The surface acoustic wave device according to claim 3, wherein the sum of the depth G of the inter-electrode-finger grooves and the thickness H of the electrode fingers satisfy $0.0407\lambda \leq G + H$.

18. The surface acoustic wave device according to claim 3, further comprising:

a pair of reflectors which respectively have a plurality of conductor strips on the principal surface of the quartz crystal substrate and are arranged on both sides of the IDT with the IDT sandwiched therebetween along the propagation direction of the surface acoustic wave; and inter-conductor-strip grooves which are recessed in the surface of the quartz crystal substrate between adjacent conductor strips of the reflectors, wherein an angle between a first direction perpendicular to the electrode fingers and the conductor strips and the electronic axis of the quartz crystal substrate is the Euler angle ψ, at least a part of the IDT and the reflectors is arranged in a second direction intersecting the first direction at an angle δ, and the angle δ is within a range of a power flow angle ±1° of the quartz crystal substrate.

19. The surface acoustic wave device according to claim 2, further comprising:

an IC which drives the IDT.

20. The surface acoustic wave device according to claim 3, further comprising:

an IC which drives the IDT.

21. An electronic apparatus comprising:

the surface acoustic wave device according to claim 2.

22. An electronic apparatus comprising:

the surface acoustic wave device according to claim 3.

23. A sensor apparatus comprising:

the surface acoustic wave device according to claim 2.

24. A sensor apparatus comprising:

the surface acoustic wave device according to claim 3.

* * * * *